United States Patent [19]

Maeda et al.

[11] Patent Number: 6,078,095
[45] Date of Patent: *Jun. 20, 2000

[54] POWER TRANSISTOR INCLUDING A PLURALITY OF UNIT TRANSISTORS

[75] Inventors: Teruyuki Maeda; Akio Nkajima, both of Kitakatsuragi-gun, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/865,049

[22] Filed: May 29, 1997

Related U.S. Application Data

[63] Continuation of application No. 08/567,528, Dec. 5, 1995, abandoned.

[30] Foreign Application Priority Data

Dec. 5, 1994 [JP] Japan ................................. 6-301096

[51] Int. Cl.[7] .................................................. H01L 27/082
[52] U.S. Cl. ........................................... 257/579; 257/583
[58] Field of Search .................................. 257/565–573, 257/578, 579, 580, 583, 592

[56] References Cited

U.S. PATENT DOCUMENTS

| 3,746,949 | 7/1973 | Nienhuis et al. | 257/579 |
|---|---|---|---|
| 4,500,900 | 2/1985 | Shimizu | 257/580 |
| 4,994,880 | 2/1991 | Kato et al. | 257/579 |
| 5,068,702 | 11/1991 | Giannella | 257/579 |
| 5,369,298 | 11/1994 | Honda et al. | 257/583 |

FOREIGN PATENT DOCUMENTS

| 266205 | 6/1988 | European Pat. Off. . |
| 413479 | 4/1991 | European Pat. Off. . |
| 596601 | 3/1994 | European Pat. Off. . |
| 4-19705 | 1/1992 | Japan . |
| 5-76768 | 1/1993 | Japan . |
| 7-38394 | 1/1995 | Japan . |

*Primary Examiner*—David Hardy
*Attorney, Agent, or Firm*—Nixon & Vanderhye P.C.

[57] ABSTRACT

A unit transistor forming a power transistor includes a collector region, a base region, and an emitter region. A base contact portion is formed at a prescribed portion on the base region. The base region has a convex portion, which projects in the direction toward the emitter region, at a portion where the base contact portion is formed. The emitter region has, at a portion where the base region projects, a convex portion projecting in the same direction as the direction in which the base region projects. The base region has, at a portion where the emitter region projects, a concave portion. A base resistor region is expanded by the convex portion provided at the emitter region, thereby increasing the resistance value of the base resistor $R_B$. Consequently, a power transistor having a wide area of safety operation and capable of performing operation in a stable manner can be obtained without an increase in size of the transistor.

5 Claims, 5 Drawing Sheets

POWER TRANSISTOR INCLUDING A PLURALITY OF UNIT TRANSISTORS

This is a continuation of application Ser. No. 08/567,528, filed Dec. 5, 1995, now abandoned.

BACKGROUND OF THE INVENTION

1. Field of the Invention

The present invention relates to semiconductor devices, and more particularly, to a semiconductor device including a transistor which has a wide range of safe power operation and which operates in a stable manner.

2. Description of the Background Art

In a conventional power transistor of this kind included in a semiconductor device, a plurality of unit transistors are formed on the same semiconductor substrate. The collectors, bases, and emitters of respective unit transistors are electrically connected in parallel to each other, so as to enlarge area of safety operation of the power transistor.

FIG. 3 is a plan view illustrating overall interconnections of the power transistor formed of conventional unit transistors.

Referring to FIG. 3, the power transistor includes a plurality of conventional unit transistors connected in parallel.

FIG. 4 is an enlarged view of a portion A in FIG. 3.

Referring to FIG. 4, portion A shows a plan view of conventional unit transistors forming the power transistor shown in FIG. 3, and includes an epitaxial layer (collector region) 1 of a first conductivity type (N type), a base region 2 of a second conductivity type (P type), an emitter region 3 of the first conductivity type, a base contact portion 4, and an emitter contact portion 5.

FIG. 5 is a view showing the correspondence between a two-dimensional structure and a cross sectional structure of the conventional unit transistors forming the power transistor.

FIG. 5(a) shows a two-dimensional structure of the conventional unit transistors, (b) shows a cross sectional structure of the conventional unit transistors taken along the line A–A' in (a), and (c) shows a cross sectional structure of the conventional unit transistors taken along the line B–B' in (a).

Referring to FIG. 5(a), the two-dimensional structure of the conventional unit transistors includes epitaxial layer 1 of the first conductivity type, base region 2 of the second conductivity type, emitter region 3 of the first conductivity type, base contact portion 4, and emitter contact portion 5.

Referring to FIG. 5(b), the cross sectional structure of the conventional unit transistors includes epitaxial layer 1 of the first conductivity type, base region 2 of the second conductivity type, emitter region 3 of the first conductivity type, a buried layer 6 of the first conductivity type, and a semiconductor substrate 7 of the second conductivity type.

Referring to FIG. 5(c), the cross sectional structure of conventional unit transistors includes epitaxial layer 1 of the first conductivity type, base region 2 of the second conductivity type, emitter region 3 of the first conductivity type, buried layer 6 of the first conductivity type, and semiconductor substrate 7 of the second conductivity type.

In addition, an oxide film ($SiO_2$, for example) 8 and a metal electrode (Al, for example) 9 are shown in FIGS. 5(b) and (c).

Referring to FIG. 5(a), epitaxial layer 1 of the first conductivity type is a collector region common to respective unit transistors, and in the collector region, base region 2 of the first conductivity type is formed, in which the comb-shaped emitter region 3 of the second conductivity type is formed. Base contact portion 4 is provided on a "tooth" of the comb-shaped base region 2, and unit transistors are connected to each other by metal interconnections, not shown. Emitter contact portions 5 are provided in the central region and on a tooth of the comb-shaped emitter region 3, and metal interconnections (not shown) are formed. At the contact portion of the collector region which is formed of epitaxial layer 1 and common to respective unit transistors, a contact common to respective unit transistors is provided and metal interconnections are formed, which are not shown in FIG. 5.

In the specification, epitaxial layer 1 of the first conductivity type will also be referred to as collector region 1 of the first conductivity type hereinafter.

Referring to FIG. 5(b), a base resistor region 2a (pinch resistor region) serving as a base resistor $R_B$ of a transistor having the emitter contact portion 5 as an emitter is formed in base region 2. Base resistor $R_B$ has a resistance value substantially determined by pinch resistance. A length L2 shown in FIG. 5(b) is the length of base resistor region 2a.

Referring to FIG. 5(c), emitter resistor region 3b, serving as an emitter resistor $R_E$ of a transistor having an emitter active region 3a as an emitter, extends in emitter region 3 on both sides of central emitter contact portion 5. Emitter active region 3a serving as an emitter of a unit transistor is formed on one side of emitter resistor region 3b. A length L1 shown in FIG. 5(c) is a length of emitter resistor region 3b.

FIG. 6 is an equivalent circuit diagram of the unit transistors in such power transistor.

Referring to FIG. 6, the equivalent circuit includes transistors Tr and Tr', base resistor $R_B$, and emitter resistor $R_E$.

Respective collectors of transistors Tr and Tr' are connected to each other. Base resistor $R_B$ has one end connected to the gate of transistor Tr and the other end connected to the gate of transistor Tr'. Emitter resistor $R_E$ has one end connected to the emitter of transistor Tr and the other end connected to the emitter of transistor Tr'.

Portions D1–D6 shown in FIG. 5 correspond to D1–D6 in FIG. 6, respectively. More specifically, emitter active region 3a shown in FIG. 5(c) corresponds to the emitter of unit transistor Tr in FIG. 6 (D4). Emitter active region 3a is connected to metal interconnection 9 (D1) formed on emitter contact portion 5 common to respective unit transistors and located at the central region of FIG. 5 through emitter resistor region 3b (corresponding to emitter resistor $R_E$) (D5). Emitter contact portion 5 in the central region of FIG. 5(c) corresponds to the emitter of unit transistor Tr' in FIG. 6 (D1). The region of emitter contact portion 5 is connected to a metal interconnection formed on base contact portion 4 through base region 2 located immediately under emitter contact portion 5 and base resistor region 2a (or base resistor $R_B$) shown in FIG. 5(b) (D2). Epitaxial layer (collector region) 1 shown in FIG. 5 corresponds to the collector of unit transistor Tr (D6), and base region 2 adjacent to an inner end of epitaxial layer 1 corresponds to the gate of unit transistor Tr (D3).

Such a power transistor is designed to operate in a stable manner, avoiding a concentration of current on one particular unit transistor. For this purpose, it is known that each unit transistor should be designed so that the following relation of the equation (1) is established (Japanese Patent Publication No. 5-76768):

$$R_B = h_{FE}/A \times R_E \qquad (1)$$

Here, $R_B$ represents the resistance value of the base resistor (pinch resistor) connecting respective bases of the unit transistors to each other, $h_{FE}$ represents the current amplification ratio of the unit transistor, A represents the ratio between plane areas of the emitter contact portion 5 and emitter active region 3a, and $R_E$ is the resistance value of the emitter resistor.

Power transistors are required to have a wide area of safety operation, and in order to expand such area the resistance value of emitter resistor $R_E$ of each unit transistor has been adjusted to be greater and naturally the resistance value of base resistor $R_B$ has also been adjusted to be greater for the sake of stable transistor operations as can be seen from the equation (1).

However, lengths L1 and L2 of emitter resistor region 3a and base resistor region 2a, respectively, must be made longer as shown in FIGS. 5(b) and (c) so as to adjust resistance values of emitter resistor $R_E$ and base resistor $R_B$ of the unit transistor as shown in FIG. 5 to be greater.

Description will be made with specific values. Assuming that current amplification ratio $h_{FE}$ of the unit transistor is 200, ratio A between plane areas of the emitter contact portion 5 and emitter active region 3a is 1, and emitter resistor $R_E$ has the resistance value of 10 Ω, then 2 kΩ is required as the resistance value of base resistor $R_B$ as can be seen from the equation (1). Assuming, under such conditions, that sheet resistance $R_{ES}$ of the emitter of the unit transistor is 6 Ω/□, a width W1 of the emitter resistor region is 10 μm, sheet resistance $R_{BS}$ Of the pinch resistor corresponding to base resistor $R_B$ is 6 kΩ/□, and a width W2 of the base resistor region is 35 μm, then length L1 of the emitter resistor region will be 16.7 μm and length L2 of the base resistor region will be 11.7 μm to yield: L1+L2=28.4 μm. However, if the resistance value of emitter resistor $R_E$ is changed from 10 Ω to 12 Ω to expand the area of safety operation of the power transistor, base resistor $R_B$ is required to have the resistance value of 2.4 kΩ as obtained from the equation (1). Accordingly, length L1 of the emitter resistor region will be 20 μm, and length L2 of the base resistor region will be 14 μm to yield: L1+L2=34 μm. As a result, the space for the sum (L1+L2) of lengths L1 and L2 of the emitter resistor region and the base resistor region of the unit transistor is undesirably increased.

As described above, if the area of safety operation of a power transistor is to be expanded and the stable operation thereof is to be obtained, the unit transistor is increased in size, leading to an increase in size of the entire semiconductor device including the power transistor.

SUMMARY OF THE INVENTION

The present invention has been made to solve such problems, and an object thereof is to provide a power transistor having a wide range of safe power operation and capable of performing stable operations without an increase in size of the transistor.

Another object of the present invention is to reduce the size of a power transistor having a wide range of safe power operation and operating in a stable manner.

According to the present invention, a semiconductor device includes a semiconductor region of a first conductivity type having a main surface and serving as a collector, a diffusion layer of a second conductivity type formed in the semiconductor region of the first conductivity type to be in contact with the main surface and serving as a base, a diffusion layer of the first conductivity type to be formed in the diffusion layer of the second conductivity type to be in contact with the main surface and serving as an emitter, and a base contact portion formed on the diffusion layer of the second conductivity type on the main surface, in which the diffusion layer of the second conductivity type has a convex portion, projecting in a first direction toward the diffusion layer of the first conductivity type, at a portion where the base contact portion is formed, and the diffusion layer of the first conductivity type has a convex portion projecting in the first direction at a portion corresponding to and spaced apart in the first direction from the convex portion of the diffusion layer of the second conductivity type.

According to the present invention, the emitter resistor region can be expanded by the convex portion of the diffusion layer of the first conductivity type, whereby the base resistor region can be expanded to increase the base resistance.

As a result, a power transistor having a wide range of safe power operation and capable of performing stable operations can be obtained without an increase in size of the transistor.

In addition, reduction in size of the power transistor can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
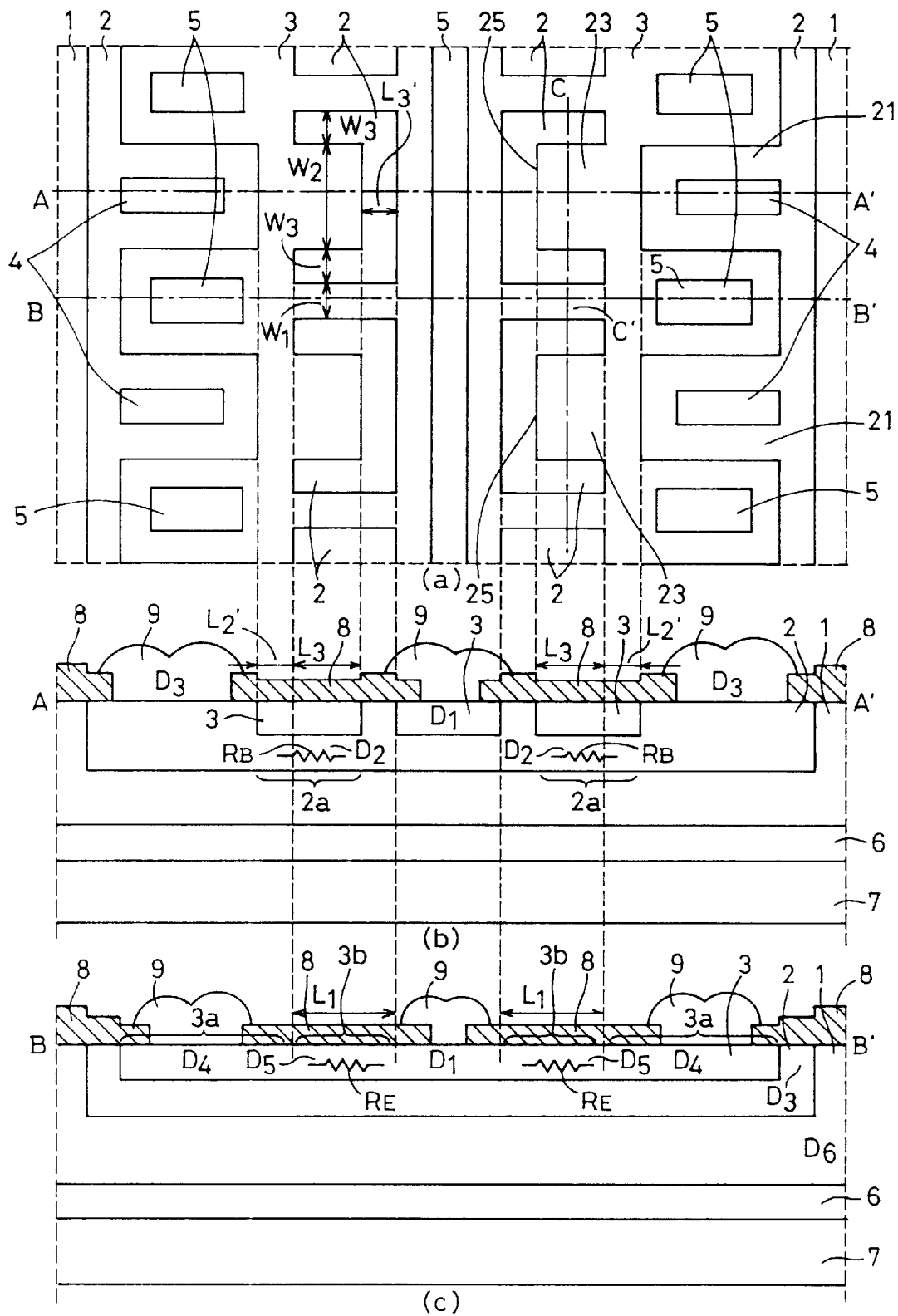
FIG. 1 shows the correspondence between a two-dimensional structure and a cross sectional structure of a unit transistor forming a power transistor according to one embodiment of the present invention.

Description will now be made of a preferred embodiment of a semiconductor device according to the present invention with reference to the drawings. In the figures, the identical characters indicate the identical or corresponding portions.

FIG. 1(a) shows a two-dimensional structure of a unit transistor included in a power transistor in accordance with one embodiment of the present invention, (b) shows a cross sectional structure of the unit transistor taken along the line A–A' in (A), and (c) shows a cross sectional structure of the unit transistor taken along the line B–B' in (a).

Referring to FIG. 1(a), the two-dimensional structure of the unit transistor in accordance with the present invention includes epitaxial layer (collector region) 1 of the first conductivity type, base region 2 of the second conductivity type, emitter region 3 of the first conductivity type, base contact portion 4 and an emitter contact portion 5.

Referring to FIGS. 1(b) and (c), the cross sectional structure of the unit transistor in accordance with the present invention includes epitaxial layer (collector region) 1 of the first conductivity type, base region 2 of the second conductivity type, emitter region 3 of the first conductivity type, buried layer 6 of the first conductivity type, and semiconductor substrate 7 of the second conductivity type.

In addition, oxide layer (such as $SiO_2$) 8 and metal electrode (such as Al) 9 are shown in FIGS. 1(b) and (c).

The collectors, bases, and emitters of respective gate transistors are electrically connected to each other in parallel.

In FIG. 1, buried layer 6 of the first conductivity type is formed on semiconductor substrate 7 of the second conductivity type. Epitaxial layer (collector region) 1 of the first conductivity type stacked on buried layer 6 of the first conductivity type forms a collector region common to respective unit transistors. In collector region 1, base region 2 of the second conductivity type is formed, in which a comb-shaped emitter region 3 of the first conductivity type is formed. Base contact portion 4 is provided on a portion shaped like a tooth of a comb-like base region 2, and respective unit transistors are connected to each other by metal interconnections (not shown). Emitter contact portion 5 is provided on a portion shaped like a tooth of the comb-like region and on the central region of emitter regions 3, and the metal connections (not shown) are formed. At the contact portion of collector region 1 formed by the epitaxial layer common to respective unit transistors, a contact common to respective unit transistors is provided and a metal interconnection is formed, though not shown in FIG. 1.

Figure 6:
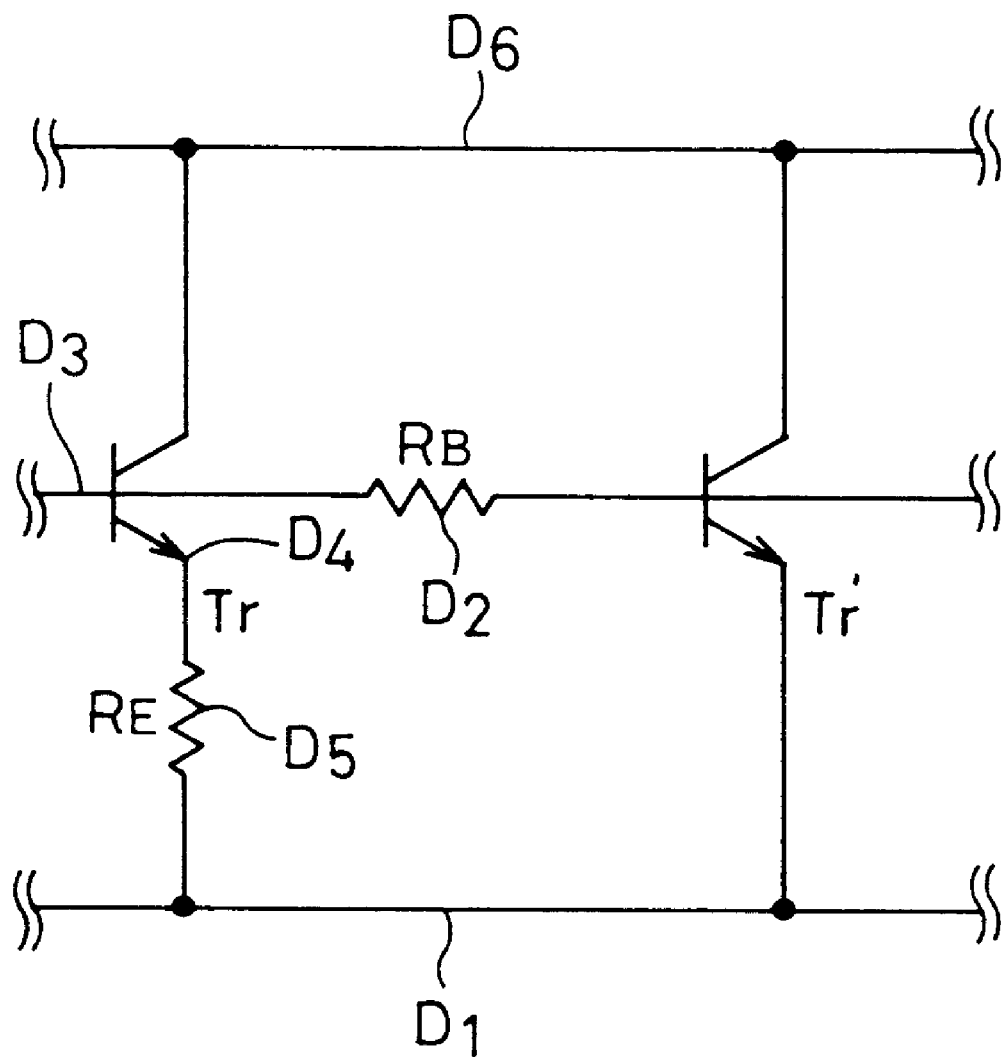
FIG. 6 is an equivalent circuit diagram of the unit transistors included in the power transistor.

The equivalent circuit of the unit transistors in accordance with the present invention is represented as in FIG. 6, similarly to the conventional transistor. Respective portions of D1–D6 shown in FIGS. 1 and 6 correspond in a manner similar to the conventional transistor.

Figure 5:
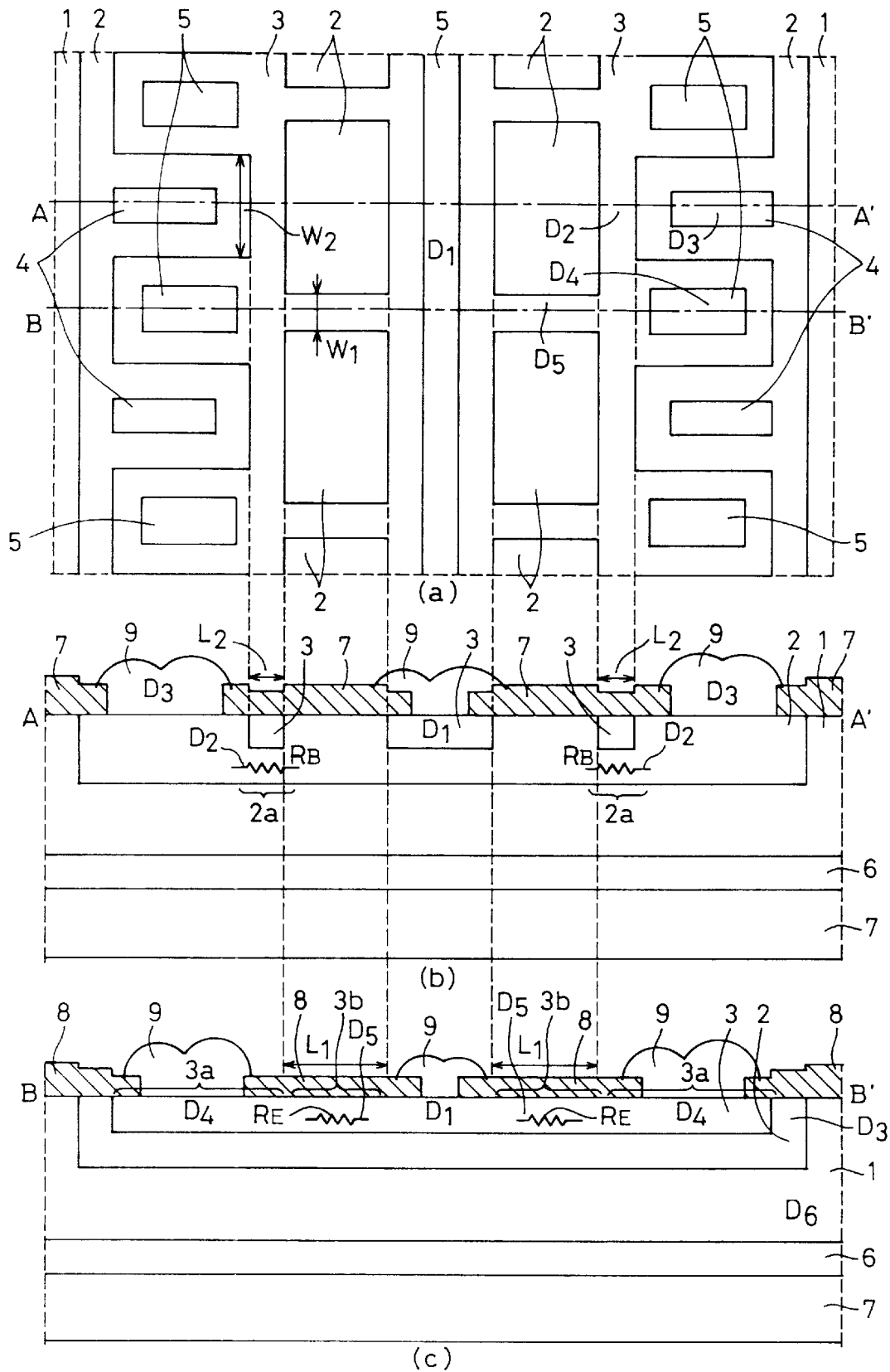
FIG. 5 shows the correspondence between a two-dimensional structure and a cross sectional structure of the unit transistor forming a conventional power transistor.

The unit transistor forming a part of the power transistor in accordance with the embodiment of the present invention shown in FIG. 1 is different from the unit transistor forming a part of the conventional power transistor shown in FIG. 5 in that the emitter pattern at a portion corresponding to each base contact portion 4 is provided to have a convex shape.

More specifically, base region 2 has a concave portion 25 opposite convex portion 23 of the comb-shaped emitter region 3 as shown in FIG. 1(a). Referring to FIG. 1(b), base resistor region 2a (pinch resistor region) which can serve a base resistor $R_B$ is formed at base region 2 of each unit transistor. Base resistor $R_B$ has a resistance value substantially determined by pinch resistance value. The sum (L2'+ L3) shown in FIG. 1(b) is the length of base resistor region 2a. Widths W3 and L3' are the widths of a portion having a concave portion 25 formed by convex portion 23 of emitter region 3 and exposed at the main surface of the base electrode. The transistor is formed to have a minimum length L2' and width W3 possible in the steps of manufacturing the transistor. Referring to FIG. 1(c), emitter resistor regions 3b extend in emitter region 3 on both sides of the central emitter contact portion 5. Emitter active region 3a serving as an emitter of the unit transistor is formed at one side of emitter region 3b. A length L1 shown in FIG. 1(c) is the length of emitter resistor region 3b.

Figure 2:
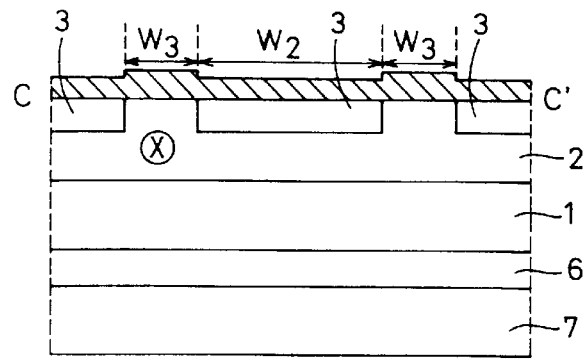
FIG. 2 shows a cross sectional structure of the unit transistor taken along the line C–C' in FIG. 1(a).
Figure 3:
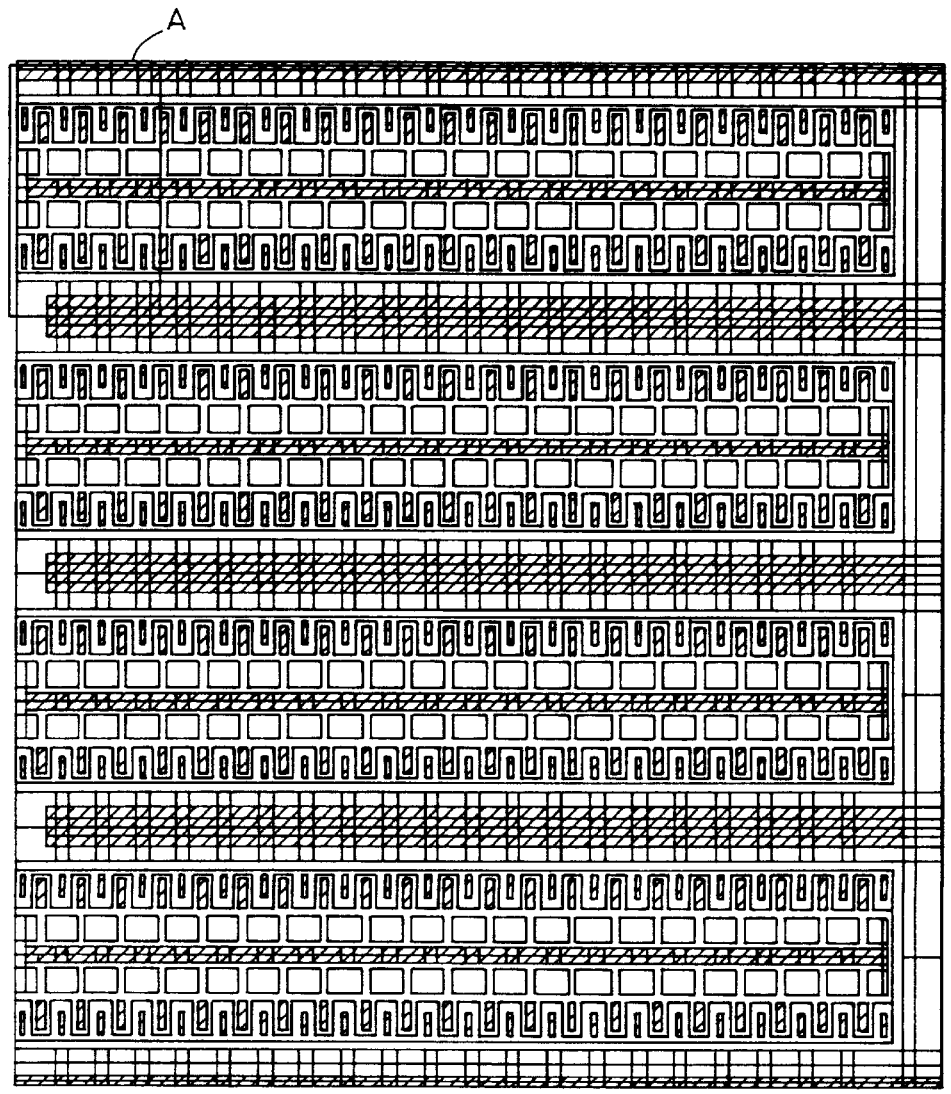
FIG. 3 is a plan view showing overall interconnections of a conventional power transistor formed by unit transistors.
Figure 4:
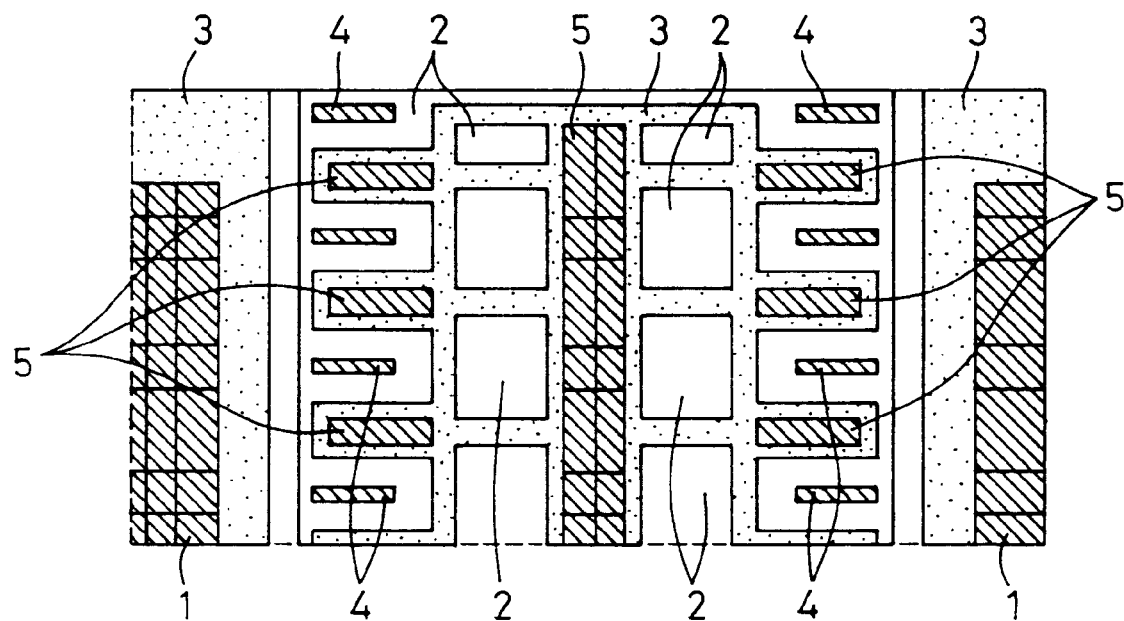
FIG. 4 is an enlarged view of portion A of the power transistor shown in FIG. 3.

FIG. 2 shows a cross sectional structure of the unit transistor in accordance with the present invention taken along the line C–C' in FIG. 1(a).

Referring to FIG. 2, the cross sectional structure of the unit transistor in accordance with the present invention includes epitaxial layer (collector region) 1 of the first conductivity type, base region 2 of the second conductivity type, emitter region 3 of the first conductivity type, buried layer 6 of the first conductivity type, and semiconductor substrate 7 of the second conductivity type.

Current flows from up to down when viewed as FIG. 2. Since emitter region 3 of the first conductivity type is provided in base region 2 of the second conductivity type as shown in FIG. 2, base resistor $R_B$ has a greater resistance value due to width W2 of the base resistor region, thereby reducing width W3 between the emitters, so that emitter resistor $R_E$ also has a greater resistance value.

Although each of width W3 and length L3' of the concave base region is 5 μm which is the smallest possible value achieved in the process in the present embodiment, the smallest possible values are desired ideally and they are not limited to such values.

As described above, the conventional technique has required to greatly adjust the resistance value of emitter resistor $R_E$ of each unit transistor for expanding the area of safety operation of the power transistor of this kind and to greatly adjust the resistance value of base resistor $R_B$ for stable operations of the transistor. Consequently, as shown in FIGS. 5(b) and (c), the space for adjusting sum (L1+L2) of the lengths of emitter resistor $R_E$ and base resistor $R_B$ is required in the conventional transistor. On the contrary, in the present invention, base resistor $R_B$ and emitter resistor $R_E$ can be adjusted greatly only with the space for sum (L1+L2') of the length of emitter resistor $R_E$ and a part of the length of base resistor $R_B$.

More specifically, in accordance with the present invention, length L3 which is the remaining length of base resistor $R_B$ shown in FIG. 1(b) can be increased, so that base resistor $R_B$ can be adjusted more greatly than in the conventional transistor, thereby achieving expansion of the range of safe power operation without an increase in size of the power transistor.

Description will be made in terms of comparison between the present invention and the conventional technique by giving specific values. Assuming that $h_{FE}$ of the unit transistor is 200, ratio A between plane areas of the emitter contact portion 5 and emitter active region 3a is 1, and emitter resistor $R_E$ has a resistance value adjusted to 12 Ω for the sake of expanding the area of safety operations, then base resistor $R_B$ is required to have a resistance value of 2.4 kΩ so that the transistor operates in a stable manner.

Assuming that sheet resistance $R_{ES}$ of the unit transistor is 6 Ω/□, width W1 of the emitter resistor region is 10 μm, sheet resistance $R_{BS}$ of the pinch resistor corresponding to base resistor $R_B$ is 6 kΩ/□, and width W2 of the base resistor region is 35 μm, then length L1 of the emitter resistor region is 20 μm and length L2 of the base resistor region is 14 μm in the conventional transistor. In other words, for adjustment of the resistance values of base resistor $R_B$ and emitter resistor $R_E$, the space of 34 μm (L1+L2=34 μm) is required.

However, when a unit transistor similarly including emitter resistor $R_E$ having a resistance value of 12 Ω and base resistor $R_B$ having the resistance value of 2.4 kΩ is designed based on the present invention, length L1 of the emitter resistor region should be 20 μm to obtain the emitter resistance value of 12 Ω under the conditions where sheet resistance $R_{ES}$ of the emitter of the unit transistor is 6 Ω/□ and width W1 of the emitter resistor region is 10 μm. Assuming that sheet resistance $R_{BS}$ of the pinch resistor corresponding to base resistor $R_B$ is 6 kΩ/□ and width W2 of the base resistor region is 30 μm (width W2 of the base resistor region is reduced to 30 μm due to width W3 between the emitters in FIG. 1(a)), then length L2 of the base resistor region should only be 12 μm to obtain the base resistance of 2.4 kΩ. Therefore, if length L2' of the base resistor region is 7 μm (assuming that the smallest possible length is 7 μm in the manufacturing steps of the transistor) and L3, a part of the length of the base resistor region is 5 μm, total length (L2'+L3) of the base resistor region is 12 μm, thereby obtaining the base resistance of 2.4 kΩ.

As described above, while the space required in the direction of the lengths of base and emitter resistor regions has been 34 μm (L1+L2=34 μm) in the conventional unit transistor, the space in the direction of the lengths of the base and emitter resistor regions need only be 27 μm (L2'+L1=27 μm) in the unit transistor of the present invention.

In accordance with the present invention, the area of safety operation of the power transistor can be expanded without an increase in size of the power transistor. In accordance with the embodiment of the present invention, the size of the unit transistor in the power transistor can be reduced compared with the conventional power transistor having the same area of safety operation.

Description will now be made specifically of the effects of reduction in size of the power transistor.

In the actual power transistor, a plurality of unit transistors are formed in the directions of length and width on a semiconductor substrate and respective unit transistors are electrically connected with each other in parallel. Therefore, the area per power transistor is extremely large.

For example, assuming that in a conventional power transistor 20 unit transistors are arranged in the direction of the width (in the direction of width W2 of the base resistor region) and 8 in the direction of the length (in direction of the length of the base and emitter resistor regions) and the unit transistor is 45 μm long in the direction of the width (the direction of the width of the base resistor region) and 170 μm long in the direction of the length (the direction of the length of the base and emitter resistor regions), then the power transistor area is 1.22 m$^2$ (45 μm×170 μm×20×8=1.22 m$^2$).

In contrast, in accordance with one embodiment of the present invention described above, the unit transistor size in the power transistor can be reduced by 7 μm in the direction of the length (direction of the lengths of the base and emitter resistor regions) as compared with the conventional power transistor having the same area of safety operation. Therefore, if the unit transistor is reduced in the power transistor described above based on the embodiment of the present invention, the unit transistor is 45 μm long in the direction of the width (the direction of the width of the base resistor region) and 163 μm long in the direction of the length (the direction of the lengths of the base and emitter resistor regions). Accordingly, the power transistor area will be 1.17 m$^2$ (45 μm×163 μm×20×8=1.17 m$^2$), reducing the size of power transistor by 4%.

Although an NPN type transistor is employed in the embodiment above, a PNP type transistor can also be utilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor power transistor device including a plurality of unit transistors, each of said unit transistors comprising:

a semiconductor region of a first conductivity type having a main surface and serving as a collector;

a diffusion layer of a second conductivity type formed in said semiconductor region of the first conductivity type to be in contact with said main surface and serving as a base;

a diffusion layer of the first conductivity type formed in said diffusion layer of the second conductivity type to be in contact with said main surface and serving as an emitter; and a base contact portion formed on said main surface on said diffusion layer of the second conductivity type; wherein said diffusion layer of the second conductivity type has a convex portion, projecting in a first direction parallel with the main surface and towards said diffusion layer of the first conductivity type, at a portion where said base contact portion is formed;

said diffusion layer of the first conductivity type having a convex portion projecting in said first direction at a portion corresponding to and spaced apart in said first direction from the convex portion of the diffusion layer of the second conductivity type;

collectors, bases and emitters of respective unit transistors being electrically connected with each other in parallel via said semiconductor region and said diffusion layers;

said diffusion layer of the second conductivity type also having a C-shaped or inverted C-shaped portion exposed to said main surface and being formed by an edge of the convex portion of said diffusion layer of the first conductivity type and a contiguous portion of said diffusion layer of the first conductivity type which circumscribes said C-shaped or inverted C-shaped portion, wherein a base resistance between respective base portions of said unit transistors is thereby increased, said base resistance having a value dependent upon physical dimensions of the convex portions of said diffusion layer of the first conductivity type and said diffusion layer of the second conductivity type, such that the power transistor device can safely operate over a wide range of power levels.

2. A semiconductor power transistor device including a plurality of unit transistors, each of said unit transistors comprising:

a semiconductor region of a first conductivity type having a main surface and serving as a collector;

a diffusion layer of a second conductivity type formed in said semiconductor region of the first conductivity type to be in contact with said main surface and serving as a base;

a diffusion layer of the first conductivity type formed in said diffusion layer of the second conductivity type to be in contact with said main surface and serving as an emitter; and a base contact portion formed on said main surface on said diffusion layer of the second conductivity type; wherein said diffusion layer of the second conductivity type has a convex portion, projecting in a first direction parallel with the main surface and towards said diffusion layer of the first conductivity type, at a portion where said base contact portion is formed;

said diffusion layer of the first conductivity type having a convex portion projecting in said first direction at a portion corresponding to and spaced apart in said first direction from the convex portion of the diffusion layer of the second conductivity type;

collectors, bases and emitters of respective unit transistors being electrically connected with each other in parallel via said semiconductor region and said diffusion layers;

said diffusion layer of the second conductivity type also having a C-shaped or inverted C-shaped portion exposed to said main surface and being formed by an edge of the convex portion of said diffusion layer of the first conductivity type and a contiguous portion of said diffusion layer of the first conductivity type which circumscribes said C-shaped or inverted C-shaped portion, wherein a base resistance between respective base portions of said unit transistors is thereby increased, said base resistance having a value dependent upon physical dimensions of the convex portions of said diffusion layer of the first conductivity type and said diffusion layer of the second conductivity type, such that the power transistor device can safely operate over a wide range of power levels, wherein a width of said C-shaped or inverted C-shaped portion, where exposed to said main surface, is not substantially greater than 5 μm.

3. A semiconductor power transistor device including a plurality of unit transistors, each of said unit transistors comprising:

a semiconductor region of a first conductivity type having a main surface and serving as a collector;

a diffusion layer of a second conductivity type formed in said semiconductor region of the first conductivity type to be in contact with said main surface and serving as a base;

a diffusion layer of the first conductivity type formed in said diffusion layer of the second conductivity type to be in contact with said main surface and serving as an emitter; and a base contact portion formed on said main surface on said diffusion layer of the second conductivity type; wherein said diffusion layer of the second conductivity type has a convex portion, projecting in a first direction towards said diffusion layer of the first conductivity type, at a portion where said base contact portion is formed;

said diffusion layer of the first conductivity type has a convex portion projecting in said first direction at a portion corresponding to and spaced apart in said first direction from the convex portion of the diffusion layer of the second conductivity type;

collectors, bases and emitters of respective unit transistors being electrically connected with each other in parallel and wherein a base resistance is formed between respective base portions of said unit transistors, said base resistance having a value determined in accordance with the convex portions of said diffusion layer of the first conductivity type and said diffusion layer of the second conductivity type to permit the power transistor device to safely operate in a wider range of power levels without increasing the size of said power transistor;

wherein each of the convex portion formed at said diffusion layer of the second conductivity type and the convex portion formed at said diffusion layer of the first conductivity type is rectangular.

4. A semiconductor power transistor device including a plurality of unit transistors, each of said unit transistors comprising:

a semiconductor region of a first conductivity type having a main surface and serving as a collector;

a diffusion layer of a second conductivity type formed in said semiconductor region of the first conductivity type to be in contact with said main surface and serving as a base;

a diffusion layer of the first conductivity type formed in said diffusion layer of the second conductivity type to be in contact with said main surface and serving as an emitter; and a base contact portion formed on said main surface on said diffusion layer of the second conductivity type; wherein said diffusion layer of the second conductivity type has a convex portion, projecting in a first direction towards said diffusion layer of the first conductivity type, at a portion where said base contact portion is formed;

said diffusion layer of the first conductivity type has a convex portion projecting in said first direction at a portion corresponding to and spaced apart in said first direction from the convex portion of the diffusion layer of the second conductivity type;

collectors, bases and emitters of respective unit transistors being electrically connected with each other in parallel and wherein a base resistance is formed between respective base portions of said unit transistors, said base resistance having a value determined in accordance with the convex portions of said diffusion layer of the first conductivity type and said diffusion layer of the second conductivity type to permit the power transistor device to safely operate in a wider range of power levels without increasing the size of said power transistor;

wherein said diffusion layer of the second conductivity type has a concave portion formed by the convex portion of said diffusion layer of the first conductivity type, and wherein a dimension of said concave portion in a direction substantially perpendicular to said first direction and in parallel to said main surface is substantially the same as a dimension of the convex portion formed at said diffusion layer of the first conductivity type in the direction substantially perpendicular to said first direction and in parallel to said main surface.

5. The semiconductor device according to claim 1, wherein transistors in said plurality of transistors are axisymmetrically arranged in pairs.

* * * * *

UNITED STATES PATENT AND TRADEMARK OFFICE

CERTIFICATE OF CORRECTION

PATENT NO. : 6,078,095
DATED : June 20, 2000
INVENTOR(S) : MAEDA et al.

It is certified that error appears in the above-identified patent and that said letters patent is hereby corrected as shown below:

IN THE TITLE PAGE:

Item [75] should read as follows:

[75] Inventors: Teruyuki Maeda; Akio Nakajima, both of Kitakatsuragi-gun, Japan Signed and Sealed this Twenty-second Day of May, 2001

*Attest:*

NICHOLAS P. GODICI

*Attesting Officer*            *Acting Director of the United States Patent and Trademark Office*